(12) United States Patent
Xie et al.

(10) Patent No.: US 11,659,726 B2
(45) Date of Patent: May 23, 2023

(54) ORGANIC ELECTROLUMINESCENCE DISPLAY PANEL, COLOR SHIFT REDUCING METHOD AND MANUFACTURING METHOD THEREOF AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Jiangrong Xie, Beijing (CN); Chao Kong, Beijing (CN); Kening Zheng, Beijing (CN); Yamin Yang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 303 days.

(21) Appl. No.: 16/766,727

(22) PCT Filed: May 24, 2019

(86) PCT No.: PCT/CN2019/088374
§ 371 (c)(1),
(2) Date: May 25, 2020

(87) PCT Pub. No.: WO2020/237432
PCT Pub. Date: Dec. 3, 2020

(65) Prior Publication Data
US 2021/0408426 A1 Dec. 30, 2021

(51) Int. Cl.
*H10K 50/15* (2023.01)
*H10K 59/35* (2023.01)
(Continued)

(52) U.S. Cl.
CPC ......... *H10K 50/15* (2023.02); *H10K 59/353* (2023.02); *H10K 71/00* (2023.02); *H10K 71/166* (2023.02); *H10K 2102/351* (2023.02)

(58) Field of Classification Search
CPC ............ H01L 27/3218; H01L 51/5056; H01L 51/0011; H01L 51/56
(Continued)

(56) References Cited

U.S. PATENT DOCUMENTS

| 7,321,197 B2 | 1/2008 | Nakayama et al. |
| 9,142,597 B2 | 9/2015 | Moon et al. |

(Continued)

FOREIGN PATENT DOCUMENTS

| CN | 1592525 A | 3/2005 |
| CN | 101295767 A | 10/2008 |

(Continued)

OTHER PUBLICATIONS

Written Opinion dated Mar. 30, 2020 for PCT Patent Application No. PCT/CN2019/088374.

(Continued)

*Primary Examiner* — Matthew E. Gordon
(74) *Attorney, Agent, or Firm* — Perilla Knox & Hildebrandt LLP; Kenneth A. Knox

(57) ABSTRACT

An organic electroluminescence display panel, a manufacturing method, a color shift reducing method, and a display device are provided. The display panel includes a flat surface portion and a curved surface portion. The hole transport layer of the display panel includes a common hole transport layer and hole transport units. The common hole transport layer is distributed in the flat surface portion and the curved surface portion. The hole transport units are disposed on the common hole transport layer and are in one-to-one relationship with sub-pixels of the two portions; the hole transport (Continued)

layer of the sub-pixel of at least one color has different thickness in the two portions; and the thickness of the hole transport layer of the sub-pixel is the sum of the thickness of the common hole transport layer in sub-pixel and the thickness of the hole transport unit of the sub-pixel.

10 Claims, 6 Drawing Sheets

(51) Int. Cl.
  *H10K 71/00* (2023.01)
  *H10K 71/16* (2023.01)
  *H10K 102/00* (2023.01)
(58) Field of Classification Search
  USPC .......................................................... 257/40
  See application file for complete search history.

(56) References Cited

U.S. PATENT DOCUMENTS

| | | |
|---|---|---|
| 9,842,886 B2 | 12/2017 | Song et al. |
| 10,204,967 B2 | 2/2019 | Song et al. |
| 2005/0236982 A1 | 10/2005 | Nakayama et al. |
| 2014/0319483 A1* | 10/2014 | Moon .................. H01L 27/3241 257/40 |
| 2016/0240591 A1* | 8/2016 | Song .................... H01L 27/3211 |
| 2018/0108712 A1 | 4/2018 | Song et al. |
| 2019/0043930 A1 | 2/2019 | Wang et al. |
| 2019/0131357 A1 | 5/2019 | Song et al. |

FOREIGN PATENT DOCUMENTS

| | | | |
|---|---|---|---|
| CN | 105895659 A | 8/2016 | |
| CN | 107482038 A | 12/2017 | |
| CN | 108053762 A | 5/2018 | |
| CN | 108305579 A | 7/2018 | |
| CN | 108461041 A * | 8/2018 | ............. G09F 9/301 |
| CN | 108461041 A | 8/2018 | |
| CN | 108711577 A | 10/2018 | |
| CN | 108987450 A | 12/2018 | |
| WO | 2019223456 A1 | 11/2019 | |

OTHER PUBLICATIONS

1st Office Action dated Apr. 8, 2020 for Chinese Patent Application No. 201980000726.6.

* cited by examiner

ORGANIC ELECTROLUMINESCENCE DISPLAY PANEL, COLOR SHIFT REDUCING METHOD AND MANUFACTURING METHOD THEREOF AND DISPLAY DEVICE

CROSS-REFERENCE TO RELATED APPLICATION

This application is a national phase application under 35 U.S.C. § 371 of International Patent Application No. PCT/CN2019/088374 filed on May 24, 2019, entitled "ORGANIC ELECTROLUMINESCENCE DISPLAY PANEL, COLOR SHIFT REDUCING METHOD AND MANUFACTURING METHOD THEREOF AND DISPLAY DEVICE," the disclosure of which is incorporated by reference in its entirety herein.

TECHNICAL FIELD

The present disclosure relates to the field of display technology and, in particular, to an organic electroluminescence display panel and a manufacturing method thereof, as well as a color shift reducing method for an organic electroluminescence display panel and a display device.

BACKGROUND

When a display device is viewed at the same viewing angle, due to a certain tilt angle between the viewing angle and the display screen, the luminescence spectrum of the light emitted vertically from the display screen is different from the luminescence spectrum received by human eyes at a certain tilted viewing angle.

For example, for a curved display screen that is increasingly widely used at present, the tilt angle between the tangent angle of the curved portion of the curved display screen and the viewing angle is large. Therefore, color shift often occurs in the curved portion, thereby affecting the viewing experience of the curved display screen.

It should be noted that the information about the prior art described in the above background section is only used to enhance the understanding of the background of the present disclosure and therefore, may include information that does not constitute prior art known to those of ordinary skill in the art.

SUMMARY

The present disclosure aims to provide an organic electroluminescence display panel and a manufacturing method thereof, as well as provide a method of reducing color shift of the organic electroluminescence display panel and a display device that solve the problem of color shift occurring in different areas of the existing organic electroluminescence display panel.

According to a first aspect of the present disclosure, there is provided an organic electroluminescence display panel having a flat surface portion and a curved surface portion. A hole transport layer of the display panel includes: a common hole transport layer distributed in the flat surface portion and the curved surface portion; and a plurality of hole transport units disposed on the common hole transport layer, and in a one-to-one relationship with sub-pixels of the flat surface portion and the curved surface portion; where the hole transport layer of the sub-pixel of at least one color has a different thickness in the flat surface portion and the curved surface portion; and where the thickness of the hole transport layer of the sub-pixel is the sum of the thickness of the common hole transport layer in this sub-pixel and the thickness of the hole transport unit of this sub-pixel.

In an exemplary embodiment of the present disclosure, the common hole transport layer has a different thickness in the flat surface portion and the curved surface portion.

In an exemplary embodiment of the present disclosure, the hole transport unit of the sub-pixel of at least one color has a different thickness in the flat surface portion and the curved surface portion.

In an exemplary embodiment of the present disclosure, the common hole transport layer has a different thickness in the flat surface portion and the curved surface portion, and the hole transport unit of the sub-pixel of at least one color has a different thickness in the flat surface portion and the curved surface portion.

In an exemplary embodiment of the present disclosure, the plurality of hole transport units are disposed on the same side of the common hole transport layer and close to an organic light-emitting layer of the corresponding sub-pixel.

According to a second aspect of the present disclosure, there is provided a method for reducing color shift of an organic electroluminescent display panel according to any one of the above aspects, including: determining a color shift direction of the curved surface portion relative to the flat surface portion at a reference viewing angle; and adjusting the thickness of the hole transport layer of the sub-pixel of the curved surface portion according to the color shift direction.

In an exemplary embodiment of the present disclosure, adjusting the thickness of the hole transport layer of the sub-pixel of the curved surface portion includes, if the color shift direction is toward a direction of a certain color among red, green, or blue, reducing the thickness of the hole transport unit of the sub-pixel of this color in the curved surface portion.

In an exemplary embodiment of the present disclosure, adjusting the thickness of the hole transport layer of the sub-pixel of the curved surface portion includes, if the color shift direction is toward the blue direction, reducing the thickness of the common hole transport layer in the curved surface portion and increasing the thickness of the hole transport unit of the red sub-pixels and green sub-pixels.

In an exemplary embodiment of the present disclosure, determining the color shift direction of the curved surface portion relative to the flat surface portion includes: obtaining chromaticity coordinate values of the flat surface portion and the curved surface portion at the reference viewing angle; and comparing the positional direction of the chromaticity coordinate values of the curved surface portion relative to the chromaticity coordinate values of the flat surface portion in the chromaticity system, where the positional direction represents the color shift direction.

According to a third aspect of the present disclosure, there is provided a method for manufacturing an organic electroluminescence display panel. The display panel includes a flat surface portion and a curved surface portion, and the manufacturing method includes forming a common hole transport layer and forming a plurality of hole transport units. The common hole transport layer is distributed in the flat surface portion and the curved surface portion. The plurality of hole transport units are disposed on the common hole transport layer and are in a one-to-one relationship with sub-pixels of the flat surface portion and the curved surface portion. The hole transport layer of sub-pixel of at least one color has a different thickness in the flat surface portion and the curved surface portion, and the thickness of the hole transport layer of the sub-pixel is the sum of the thickness of the common hole transport layer in this sub-pixel and the thickness of the hole transport unit of this sub-pixel.

In an exemplary embodiment of the present disclosure, the common hole transport layer and the hole transport unit are formed via evaporation.

In an exemplary embodiment of the present disclosure, when the common hole transport layer has a different thickness in the flat surface portion and the curved surface portion, forming the common hole transport layer includes: forming, through a first mask, a part of the common hole transport layer, which has common thickness in the flat surface portion and the curved surface portion; and forming, through a second mask, a part of the common hole transport layer, where the thickness of which is equal to a difference of the thickness of the common hole transport layer in the flat surface portion and the thickness of the common hole transport layer in the curved surface portion.

In an exemplary embodiment of the present disclosure, when the hole transport unit of the sub-pixel of the same color has a different thickness in the flat surface portion and the curved surface portion, forming a plurality of hole transport units includes: forming, through a third mask, a part of the hole transport unit, which has common thickness in the flat surface portion and the curved surface portion; and forming, through a fourth mask, a part of the hole transport unit, where the thickness of which is equal to a difference of the thickness of the hole transport unit in the flat surface portion and the thickness of the hole transport unit in the curved surface portion.

In an exemplary embodiment of the present disclosure, when the common hole transport layer has a different thickness in the flat surface portion and the curved surface portion, forming the common hole transport layer includes: forming, through a fifth mask, a part of the common hole transport layer in the flat surface portion; and forming, through a sixth mask, a part of the common hole transport layer in the curved surface portion.

In an exemplary embodiment of the present disclosure, when the hole transport unit of the sub-pixel of the same color has a different thickness in the flat surface portion and the curved surface portion, forming the hole transport unit includes: forming, through a seventh mask, the hole transport unit of the sub-pixel in the flat surface portion; and forming, though an eighth mask, the hole transport unit of the sub-pixel in the curved surface portion.

According to a fourth aspect of the present disclosure, there is provided a display device including the organic electroluminescence display panel described in any one of the above.

According to the organic electroluminescent display panel of the present disclosure, the hole transport layer for at least one type of sub-pixels is configured to have different thickness in the flat surface portion and the curved surface portion. The thickness of the hole transport layer is the sum of the thickness of the common hole transport layer in this sub-pixel and the thickness of the hole transport unit of this sub-pixel. On one hand, by providing a hole transport layer, the thickness of which is different from that in the flat surface portion, in the curved surface portion, the intensity of the microcavity effect in the curved surface portion is changed, and then the spectrum received by human eyes can be changed by adjusting the microcavity gain spectrum, thereby reducing the color shift of the curved surface portion. On the other hand, the thickness of the hole transport layer of the display panel can be adjusted by adjusting the thickness of the common hole transport layer in this sub-pixel or the thickness of the hole transport unit corresponding to this sub-pixel. There are various adjustment methods which can be selected according to the condition of color shift. Moreover, adjusting the thickness of the hole transport unit corresponding to each sub-pixel will not affect the display effect of other sub-pixels, and the effect of the color shift reduction is more ideal.

It should be understood that the above general description and the following detailed description are only exemplary and illustrative, and do not limit the present disclosure.

BRIEF DESCRIPTION OF THE DRAWINGS

The drawings herein are incorporated into and constitute a part of this specification. The drawings show embodiments according to this disclosure, and are used together with the specification to explain the principles of this disclosure. Understandably, the drawings in the following description only illustrate some embodiments of the present disclosure. For those of ordinary skill in the art, without paying any creative work, other drawings can also be obtained based on these drawings.

DETAILED DESCRIPTION

Figure 1:
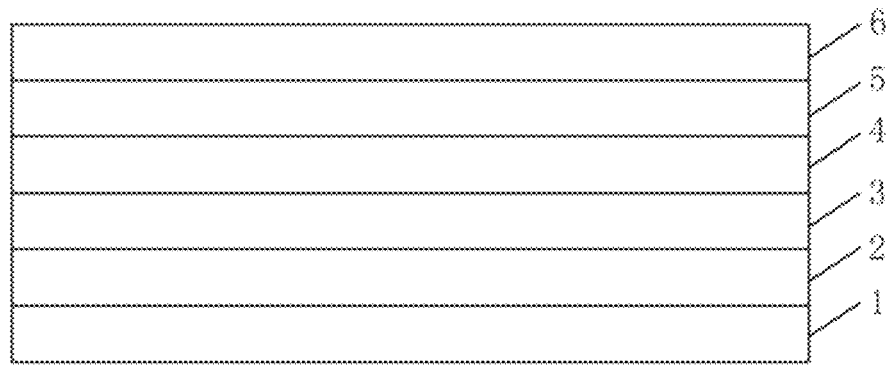
FIG. 1 is a schematic structural diagram of functional layers of a conventional organic electroluminescence display panel.

Hereinafter, illustrative embodiments will be described more fully with reference to the drawings. However, the illustrative embodiments can be implemented in various forms and should not be construed as being limited to the embodiments set forth herein; on the contrary, the present disclosure will be comprehensive and complete by providing these embodiments, so that those skilled in the art learn the idea of the embodiments. The same reference numerals in the drawings denote the same or similar structures, and thus their detailed description will be omitted.

In the drawings: 1—substrate; 2—anode; 3—hole transport layer; 4—organic light-emitting layer; 5—electron transport layer; 6—cathode; 7—shielding plate; 11—flat surface portion; 22—curved surface portion; 31—common hole transport layer; 32—hole transport unit; 321—hole transport unit of a red sub-pixel; 322—hole transport unit of a green sub-pixel and 323—hole transport unit of a blue sub-pixel.

Figure 2:
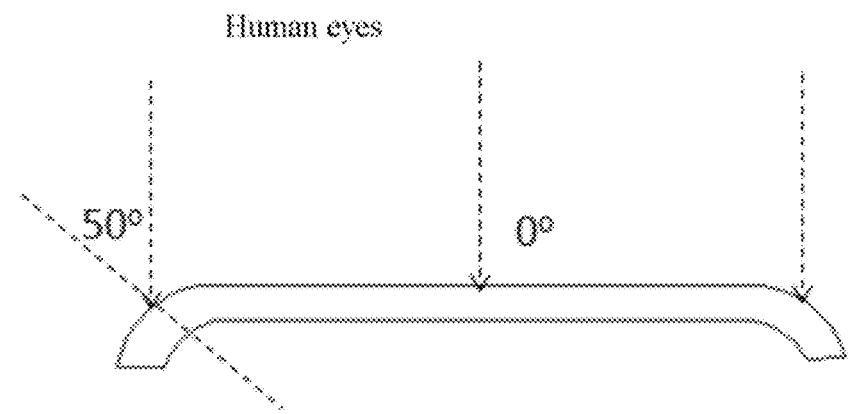
FIG. 2 is a schematic structural diagram of a double curved organic electroluminescence display panel.

As shown in FIG. 1, a stacked structure of functional layers of an organic electroluminescence display panel in the related art includes a substrate 1, an anode 2, a hole transport layer 3, an organic light-emitting layer 4, an electron transport layer 5, and a cathode 6 that are formed on the substrate successively. As shown in FIG. 2, the outer active area (AA) of a common curved display panel includes a central flat area and an edge arc area. For each functional layer, the thickness of the film stacked in the flat area is the same as the thickness of the film stacked in the curved area, and the microcavity in the flat area and the curved area are the same in theory. The spectrum received by human eyes is the superposition of the intrinsic spectrum of the material and the microcavity gain spectrum. When the material is unchanged, the visual effect of the human eyes in the flat area and in the curved area should be the same in theory. However, if the absolute angle of the flat area and the arc area are different when the flat area and the arc area are viewed by human eyes from a certain angle, then different viewing angles lead to microcavity effects with different intensity. Therefore, different brightness and chromaticity are observed. When the moving speed of color shift trajectory at a small angle is relatively fast, there will be a large change in color shift and there will be a certain color difference visually, which is easily recognized by human eyes. For example, for the structure shown in FIG. 1, the display effect when the flat area is vertically viewed at 0 degree corresponds to the situation where an absolute angle of the arc area is about 50 degrees. Therefore, when the flat area and the arc area are viewed from 0 degree at the same time, the colors of these two areas are different.

An embodiment of the present disclosure provides an organic electroluminescence display panel, which may include both a flat surface portion and a curved surface portion. The following description will be made using a double-sided curved display panel as shown in FIG. 3 as an example.

Figure 3:
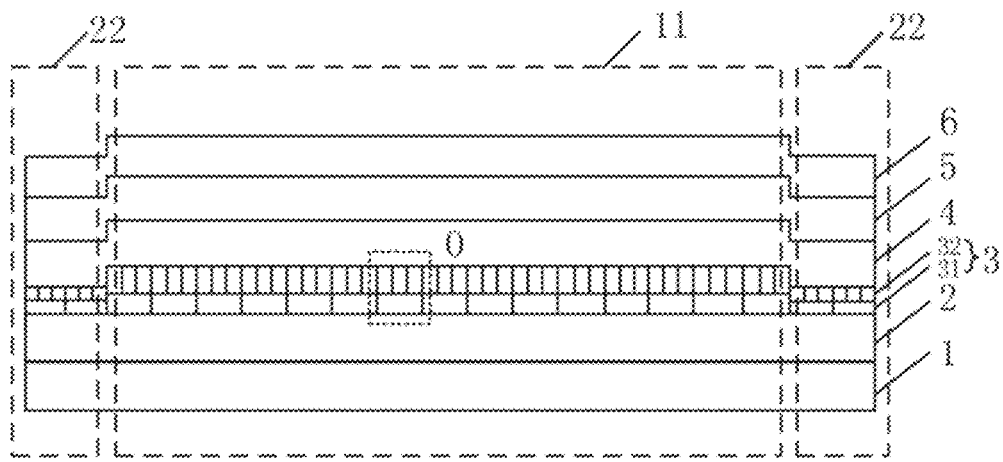
FIG. 3 is a schematic structural diagram of functional layers of an organic electroluminescence display panel of the present disclosure.
Figure 4:
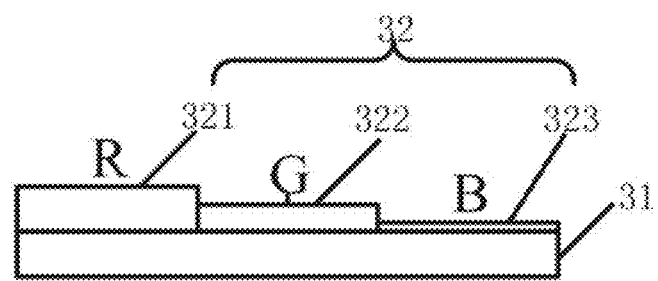
FIG. 4 is a schematic structural diagram of a hole transport layer O of a pixel unit in FIG. 3.

As shown in FIG. 3, an organic electroluminescent display panel of the embodiment of the present disclosure includes a flat surface portion and a curved surface portion. The stacked structure of the functional layers of this display panel is similar to that shown in FIG. 1, in which the hole transport layer 3 includes a plurality of hole transport units 32 and a common hole transport layer 31 that are used to transport holes. The common hole transport layer 31 is distributed on the flat surface portion 11 and the curved surface portion 22. The plurality of hole transport units 32 are disposed on the common hole transport layer 31 and are in a one-to-one relationship with the sub-pixels in the flat surface portion 11 and the curved surface portion 22. For example, as shown in FIG. 4, the hole transport units 32 of one pixel are divided into a hole transport unit 321 of a red sub-pixel, a hole transport unit 322 of a green sub-pixel, and a hole transport unit 323 of a blue sub-pixel according to the color of the sub-pixels.

The hole transport layer of the sub-pixel of at least one color has a different thickness in the flat surface portion 11 and the curved surface portion 22, where the thickness of the hole transport layer of the sub-pixel is the sum of the thickness of the common hole transport layer 31 in the sub-pixel and the thickness of the hole transport unit 32 of the sub-pixel. The microstructure of the hole transport layer 3 is only briefly depicted in FIG. 3, which schematically shows that the hole transport layer 3 of the sub-pixel has a different thickness in the flat surface portion 11 and the curved surface portion 22.

Figure 5:
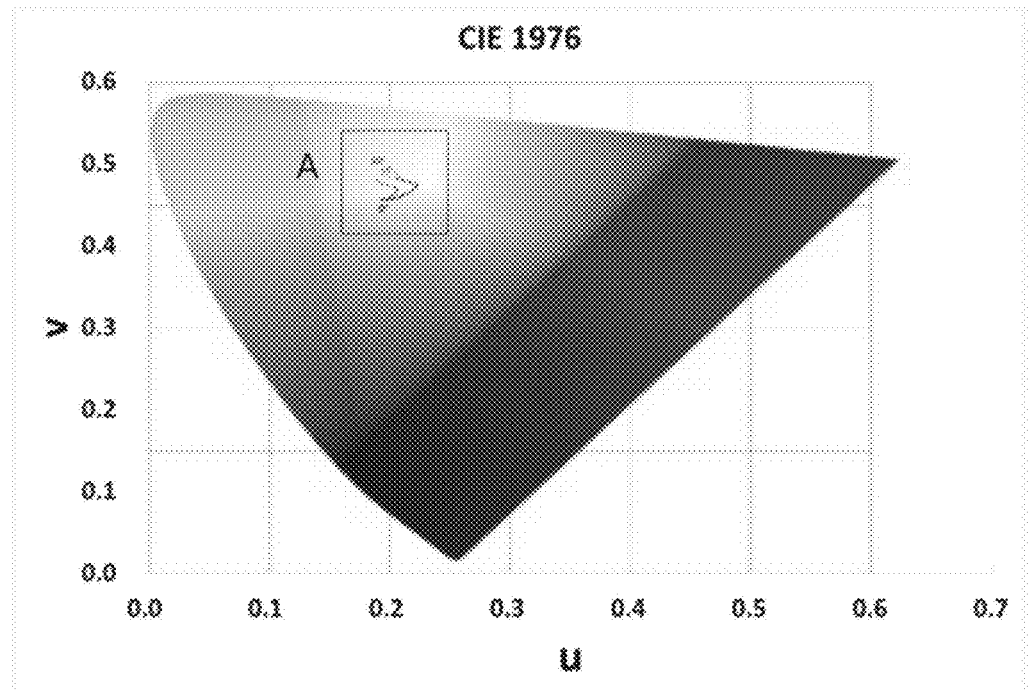
FIG. 5 shows a trend of color shift trajectory, in the CIE 1976 uniform chromaticity system, of the fitted white light from 0 degree to 70 degree before and after the hole transport distance is adjusted.
Figure 6:
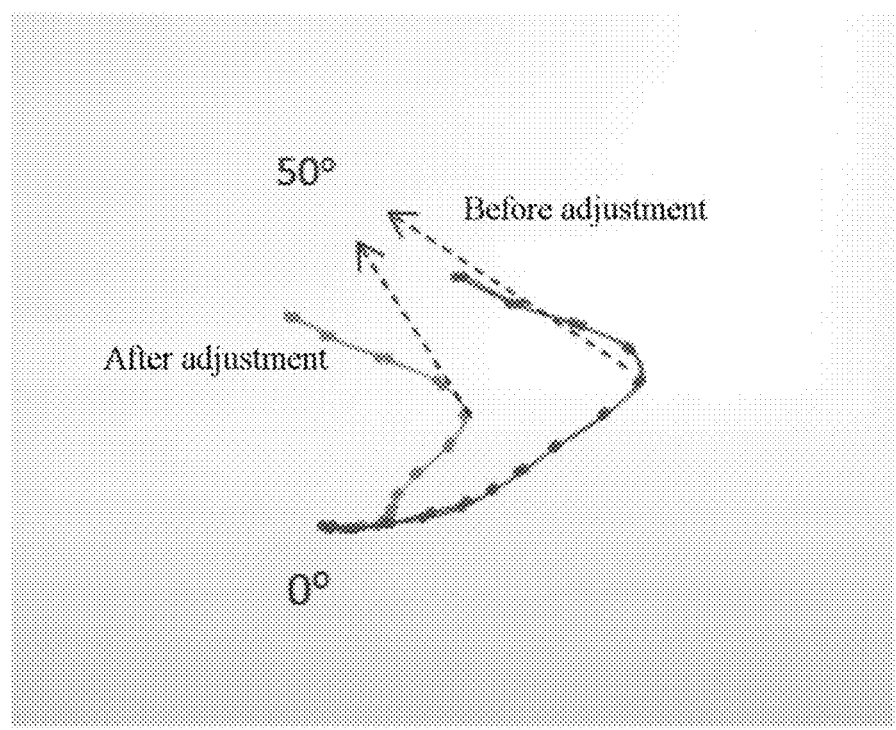
FIG. 6 is a partial enlarged view of part A in FIG. 5.

Since the spectrum received by human eyes is a superposition of the intrinsic spectrum of the material and the microcavity gain spectrum, when the material is unchanged, the spectrum received by human eyes may be changed by adjusting the microcavity gain spectrum. The thickness of the hole transport layer of the sub-pixel affects the vertical transport distance of the holes, and the vertical transport distance of the holes in the sub-pixel is an important factor affecting the microcavity effect. Therefore, when the hole transport layer of the sub-pixel of at least one color has a different thickness in the flat surface portion 11 and the curved surface portion 22, the microcavity effect of the sub-pixel in the flat surface portion 11 and the microcavity effect of the sub-pixel in the curved surface portion 22 are different. Accordingly, the spectrum of the emergent light from the flat surface portion 11 and the spectrum of the emergent light from the curved surface portion 22 of the sub-pixel, which are received by human eyes, are different. If the thickness of the hole transport layer is properly controlled, when the display panel is viewed from the same viewing angle, the visual difference between the emergent light from the flat surface portion 11 and the emergent light from the curved surface portion 22 received by human eyes is difficult for human eyes to perceive, and thus the color shift of the flat surface portion 11 relative to the curved surface portion 22 can be reduced. For example, the thickness of the hole transport unit of the red sub-pixel in the curved surface portion is reduced, and the color shift trajectory of the curved surface portion before and after adjusting the thickness is analyzed. The color shift trajectory before the adjustment and the color shift trajectory after the adjustment is show in FIG. 5 and FIG. 6. Specifically, the color shift trajectory of the curved surface portion at the viewing angle of 0-70 degrees (at an interval of 5 degrees) is shown and the chromaticity at the viewing angle of 50 degrees (the trajectory point indicated by the arrow) before and after the adjustment is compared. Before the thickness is adjusted, length distance of the viewing angle of 0-50 degrees (i.e., color shift; in the CIE 1976 uniform chromaticity system, the distance between two points is used to evaluate the color shift) changes greatly toward the red direction, which represents a serious red color shift. After the thickness is adjusted, the red color shift is significantly reduced compared to that before the adjustment. It can be seen that the color shift of the curved surface portion is reduced by changing the thickness of the hole transport layer in the curved surface portion according to the present disclosure, and the color shift is not visible to human eyes after the adjustment. Therefore, as long as there is the color shift between the curved surface portion and the flat surface portion, which is caused due to the difference in the microcavity effect, it can be reduced by adopting such display panel structure.

The organic electroluminescent display panel according to the embodiment of the present disclosure will be described in detail by taking the structure shown in FIG. 3 as an example.

In an exemplary embodiment, the common hole transport layer 31 has a different thickness in the flat surface portion 11 and the curved surface portion 22, so that the flat surface portion 11 and the curved surface portion 22 of the display panel form microcavity effect with different intensity, thereby making the microcavity gain spectrum of the flat surface portion 11 and the curved surface portion 22 inconsistent. Therefore, by adjusting the thickness of the common hole transport layer 31 in the flat surface portion 11 and the curved surface portion 22, the microcavity gain spectrum of the flat surface portion 11 and the curved surface portion 22 can be adjusted, so that the flat surface portion 11 and the curved surface portion 22 present the same color at the same viewing angle, i.e., the color shift is reduced.

In another exemplary embodiment, the hole transport unit 32 of the sub-pixel of at least one color has a different thickness in the flat surface portion 11 and the curved surface portion 22, thereby making the sub-pixel form microcavity effect with different intensity on the flat surface portion 11 and curved surface portion 22 of the display panel. Therefore, the sub-pixel has a different microcavity gain spectrum in the flat surface portion 11 and curved surface portion 22. Alternatively, the hole transport unit 32 of the sub-pixel of any two colors may have different thickness in the flat surface portion 11 and the curved surface portion 22, or the hole transport unit 32 of the sub-pixel of three colors may have different thickness in the flat surface portion 11 and the curved surface portion 22. Therefore, according to the condition of the color shift, the thickness of the hole transport unit 32 of the sub-pixel of one, two or three colors in the flat surface portion 11 and the curved surface portion 22 can be adjusted, and then the microcavity gain spectrum of the sub-pixel of the corresponding color in the flat surface portion 11 and the curved surface portion 22 can be adjusted, so that the sub-pixels of the corresponding color in the flat surface portion 11 and the curved surface portion 22 present the same color at the same viewing angle, reducing the color shift.

In yet another exemplary embodiment, the common hole transport layer 31 has a different thickness in the flat surface portion 11 and the curved surface portion 22, and the hole transport unit 32 of the sub-pixel of at least one color has a different thickness in the flat surface portion 11 and the curved surface portion 22, so that in the display panel, the sub-pixel has a different microcavity gain spectrum in the flat surface portion 11 and the curved surface portion 22, thereby reducing the color shift. This is because, when the common hole transport layer has a large thickness difference between the flat surface portion 11 and the curved surface portion 22, a ratio of corresponding sub-pixels in the two portions will change too much, so that the color shift is not reduced as desired. Therefore, on the basis that the common hole transport layer has a different thickness in the two portions, the thickness of the hole transport unit needs to be adjusted for chromaticity compensation, so that the color shift can be better reduced.

According to the present disclosure, all the hole transport units 32 may be arranged on the same side of the common hole transport layer 31, either the upper side or the lower side. Alternatively, a part of the hole transport units 32 may be arranged on the upper side of the common hole transport layer 31 and a part of the hole transport units 32 may be arranged on the lower side of the common hole transport layer 31. In an exemplary embodiment of the present disclosure, as shown in FIG. 3, the hole transport units 32 are all disposed on the common hole transport layer 31 and cover the common hole transport layer 31. An organic light-emitting layer of a corresponding sub-pixel is above each hole transport unit 32. The structure is simple to manufacture because the common hole transport layer 31 can be formed in one step by using a mask.

Those skilled in the art may understand that the structure of the curved surface portion 22 shown in FIG. 3 is only an example, and therefore, in other embodiments, the number of the curved surface portion 22 may be only one or more than one. When there are a plurality of curved surface portions 22, the curvature of the plurality of curved surface portions 22 may be the same or different, which will not be listed herein one by one.

Embodiments of the present disclosure further provide a method for reducing the color shift of an organic electroluminescence display panel. Taking the structure of FIG. 1 as an example, the method includes the following steps.

In step S100, a color shift direction of the curved surface portion 22 relative to the flat surface portion 11 is determined at a reference viewing angle.

In step S200, the thickness of the hole transport layer of the sub-pixels in the curved surface portion 22 is adjusted according to the color shift direction.

In step S100, the reference viewing angle refers to vertical viewing from top to bottom, that is, a viewing angle of 0 degree in the figure. There are many methods for determining the color shift. For example, when the color is shifted significantly and can be perceived with naked eyes, the color shift can be directly observed and determined. For example, when the color is shifted slightly and is difficult to be perceived with naked eyes, the color shift may be determined by using a chromaticity system. In order to ensure accurate determination, in the present exemplary embodiment, a chromaticity system is used to determine the color shift. Specifically, chromaticity coordinate values of the flat surface portion 11 and the curved surface portion 22 are obtained at the reference viewing angle. Then, in the chromaticity system, the positional direction of the chromaticity coordinate value of the curved surface portion 22 relative to the chromaticity coordinate value of the flat surface portion 11 is obtained, and the positional direction represents the color shift direction.

In step S200, there are two specific methods for adjusting the thickness of the hole transport layer of the sub-pixels of the curved surface portion 22. One method is to adjust the thickness of the hole transport unit 32 of the sub-pixel of a certain color. Specifically, if the color shift direction is toward a certain color direction among red, green, or blue, the thickness of the hole transport unit 32 of the sub-pixel of this color is reduced.

For example, before the curved panel structure shown in FIG. 1 is adjusted, the thickness of the hole transport unit 32 of the red sub-pixel is about 710~820 Å, the thickness of the hole transport unit 32 of the green sub-pixel (G-HTL) is about 300~480 Å, the thickness of the hole transport unit 32 of the blue sub-pixel is about 50~100 Å, and the thickness of the common hole transport layer 31 is about 1,100~1300 Å.

Figure 7:
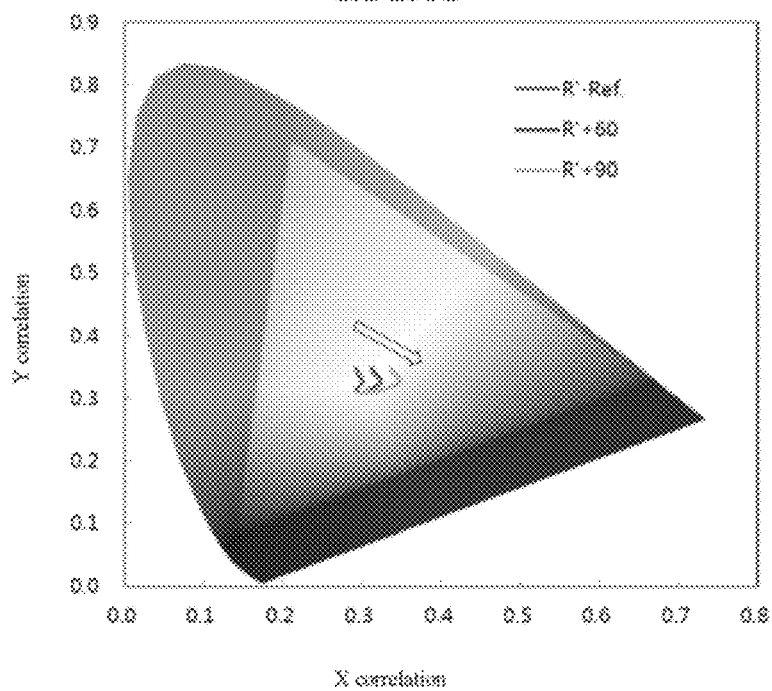
FIG. 7 shows a variation trend of the color shift trajectory, in the CIE 1931 chromaticity system, of the fitted white light from 0 degree to 70 degree as a function of a thickness variation of the hole transport unit of the red sub-pixel.
Figure 10:
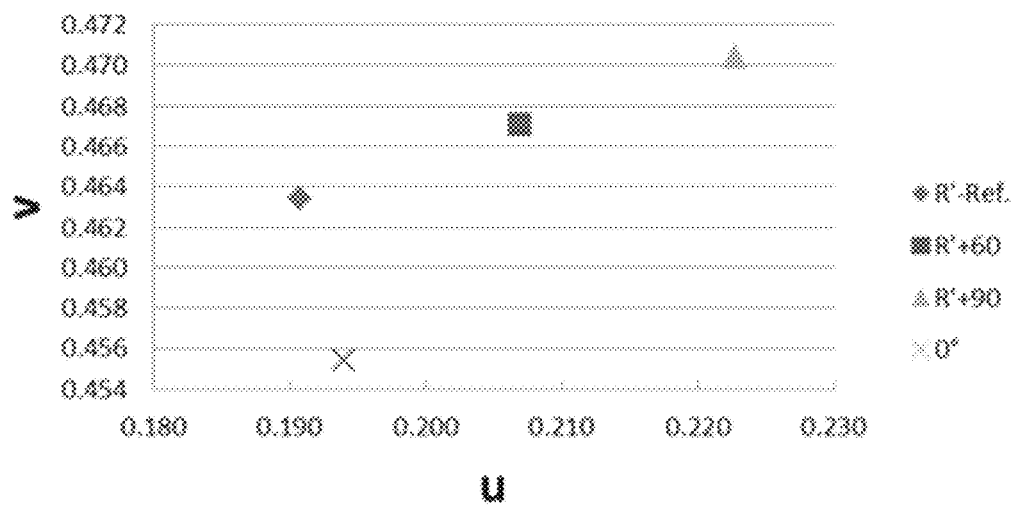
FIG. 10 shows a variation of the color shift value of the fitted white light at 50 degrees, in the CIE 1976 uniform chromaticity system, as a function of the thickness of the hole transport unit of the red sub-pixel.

Referring to FIG. 7, when the thickness of the hole transport unit 32 of the red sub-pixel is increased by 60 nm and 90 nm, respectively, the ratio of the red sub-pixel is increased, and the angle-color shift trajectory of the synthesized white light gets close to red light, and the chromaticity coordinate of the synthesized white light at a viewing angle of 50 degrees changes and the specific chromaticity changes are shown in Table 1. As can be seen from FIG. 7 and Table 1, the chromaticity coordinate of fitted white light at the viewing angle of 50 degrees shifts toward the red color as the hole transport unit 32 of the red sub-pixel (corresponding to R-HTL in the table) becomes thicker. Therefore, if the curved surface portion is redder than the flat surface portion when viewed at the reference viewing angle (viewing angle of 0 degree), the film thickness of the hole transport unit 32 of the red sub-pixel may be reduced. After applying this method to the CIE 1976 uniform chromaticity system for verification, it was found that the color shift distance at the viewing angle from 0 degree to 50 degrees decreases as the hole transport unit 32 of the red sub-pixel becomes thinner, as shown in FIG. 10. When the color shift is toward red color, by reducing the thickness of the hole transport unit 32 of the red sub-pixel to 680~790 Å, the visual effect of the curved surface portion and the visual effect of the flat surface portion are made the same.

TABLE 1

The variation trend of the chromaticity coordinate of the fitted white light at the viewing angle of 50 degrees as a function of the change of the thickness of R-HTL

| Thickness of R-HTL at edge bending zone (nm) | Chromaticity coordinate of red light (x, y) | Brightness value (cd/m$^2$) | Peak value (nm) | Full width at half maximum | Brightness of the fitted white light at 50° | Chromaticity coordinate of the fitted white light at 50° |
|---|---|---|---|---|---|---|
| R-HTL-Ref | (0.688, 0.311) | 395.2 | 626 | 34.1 | 214.5 | (0.300, 0.323) |
| R-HTL-Ref. +60 | (0.684, 0.315) | 407.6 | 628 | 35 | 229.2 | (0.323, 0.324) |
| R-HTL-Ref. +90 | (0.691, 0.309) | 356.6 | 629 | 36.3 | 244.7 | (0.345, 0.324) |

Figure 8:
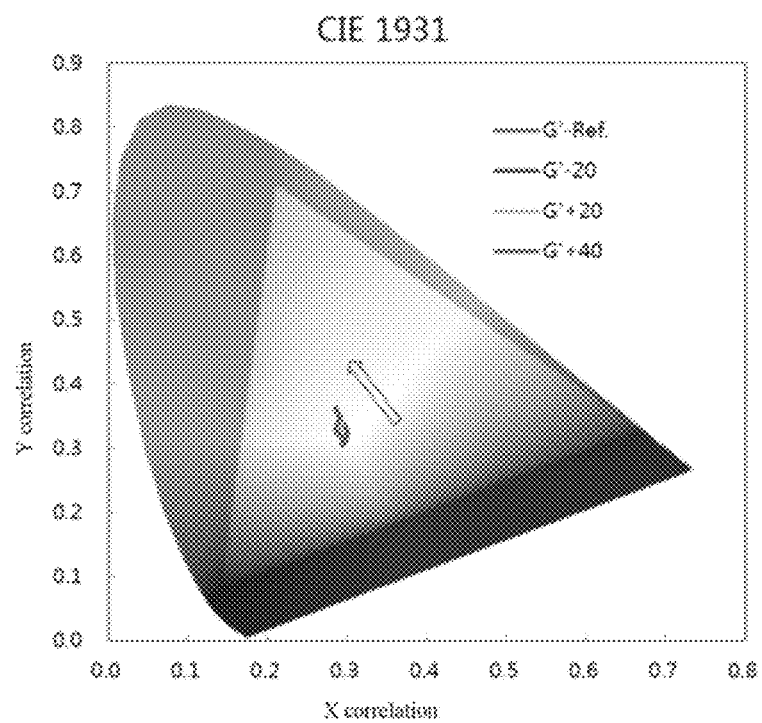
FIG. 8 shows a variation trend of the color shift trajectory, in the CIE 1931 chromaticity system, of the fitted white light from 0 degree to 70 degree as a function of a thickness variation of the hole transport unit of the green sub-pixel.
Figure 11:
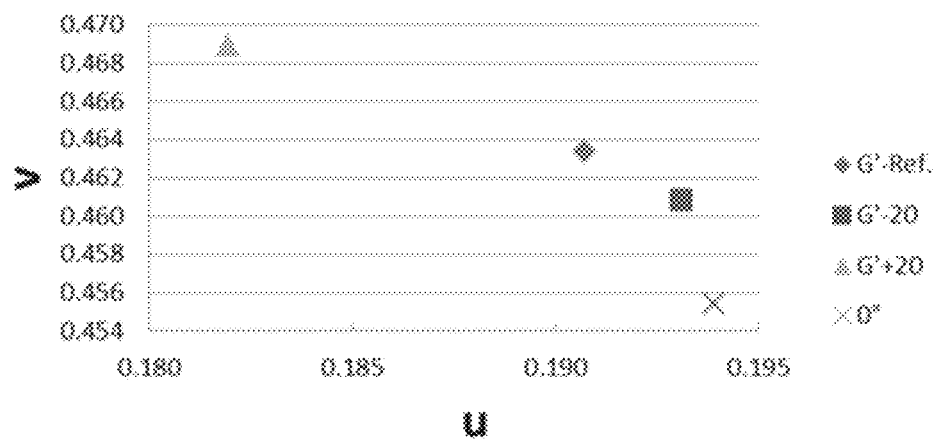
FIG. 11 shows a variation of the color shift value of the fitted white light at 50 degrees, in the CIE 1976 uniform chromaticity system, as a function of the thickness of the hole transport unit of the green sub-pixel.

Similarly, referring to FIG. 8, when the thickness of the hole transport unit 32 of the green sub-pixel is reduced by 20 nm and increased by 60 nm and 90 nm, respectively, the ratio of the green sub-pixel is increased, and the angle-color shift trajectory of the synthesized white light gets close to green light, the chromaticity coordinate of the synthesized white light at a viewing angle of 50 degrees changes and the specific chromaticity changes are shown in Table 2. As can be seen from FIG. 8 and Table 2, the chromaticity coordinate of the fitted white light at the viewing angle of 50 degrees shifts toward the green color as the hole transport unit of the green sub-pixel (corresponding to G-HTL in the table) becomes thicker. Therefore, if the curved surface portion is greener than the flat surface portion at the reference viewing angle (viewing angle of 0 degree), the film thickness of the hole transport unit 32 of the green sub-pixel may be reduced. By applying this method to the CIE 1976 uniform chromaticity system for verification, it was found that the color shift distance at the viewing angle from 0 degree to 50 degrees decreases as the hole transport unit 32 of the green sub-pixel becomes thinner, as shown in FIG. 11. When the color shift is toward the green color, by reducing the thickness of the hole transport unit 32 of the green sub-pixel to 270~450 Å, the visual effect of the curved surface portion and the visual effect of the flat surface portion are made the same.

TABLE 2

The variation trend of the chromaticity coordinate of the fitted white light at the viewing angle of 50 degrees as a function of the change of the thickness of G-HTL

| Thickness of G-HTL at edge bending zone (nm) | Chromaticity coordinate of green light (x, y) | Brightness value (cd/m$^2$) | Peak value (nm) | Full width at half maximum | Brightness of the fitted white light at 50° | Chromaticity coordinate of the fitted white light at 50° |
|---|---|---|---|---|---|---|
| G-HTL-Ref. −20 | (0.267, 0.701) | 1640.7 | 532 | 26.7 | 209.0 | (0.300, 0.319) |
| G-HTL-Ref. | (0.270, 0.697) | 1559.4 | 527 | 36.4 | 214.5 | (0.300, 0.323) |
| G-HTL-Ref. +20 | (0.291, 0.684) | 1669.9 | 536 | 32.7 | 227.5 | (0.293, 0.336) |
| G-HTL-Ref. +40 | (0.300, 0.677) | 1672.0 | 538 | 33.1 | 237.9 | (0.290, 0.345) |

The same is true for blue color. However, since the thickness of the hole transport unit 32 of the blue sub-pixel is small, the efficiency and lifetime of blue light will be greatly affected if its thickness is changed. Therefore, it is required to be cautious for changing the thickness of the hole transport unit 32 of the blue sub-pixel.

In step S200, another method of adjusting the thickness of the hole transport layer of the sub-pixels of the curved surface portion 22 is to adjust the thickness of the common hole transport layer 31 in the curved surface portion 22. Specifically, if the color shift is toward the blue color, the thickness of the common hole transport layer 31 in the curved surface portion 22 is reduced.

Figure 9:
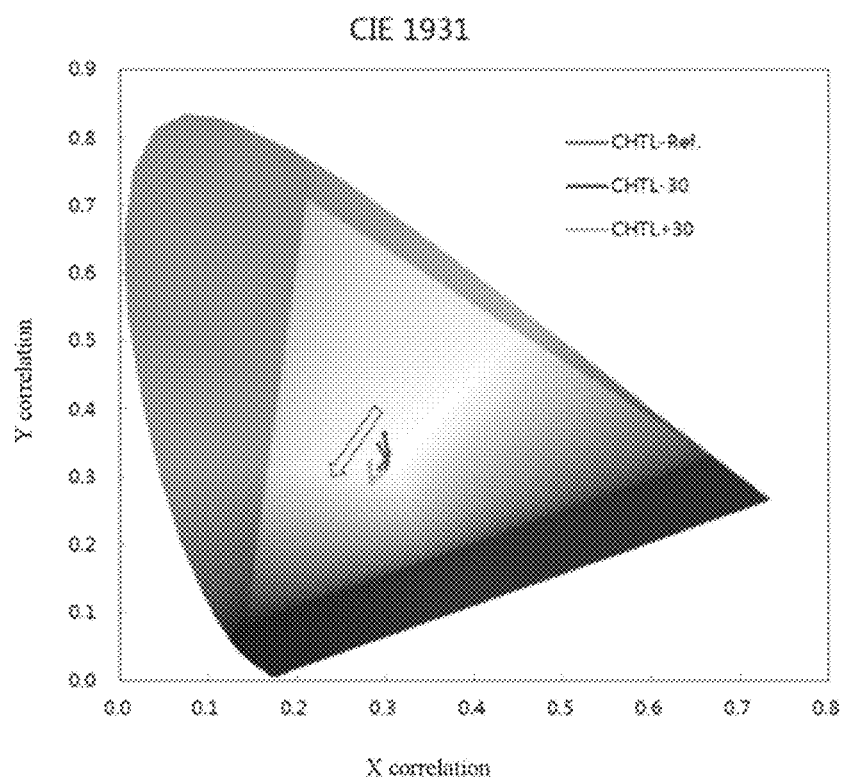
FIG. 9 shows a variation trend of the color shift trajectory, in the CIE 1931 chromaticity system, of the fitted white light from 0 degree to 70 degree as a function of a thickness variation of the common hole transport layer.
Figure 12:
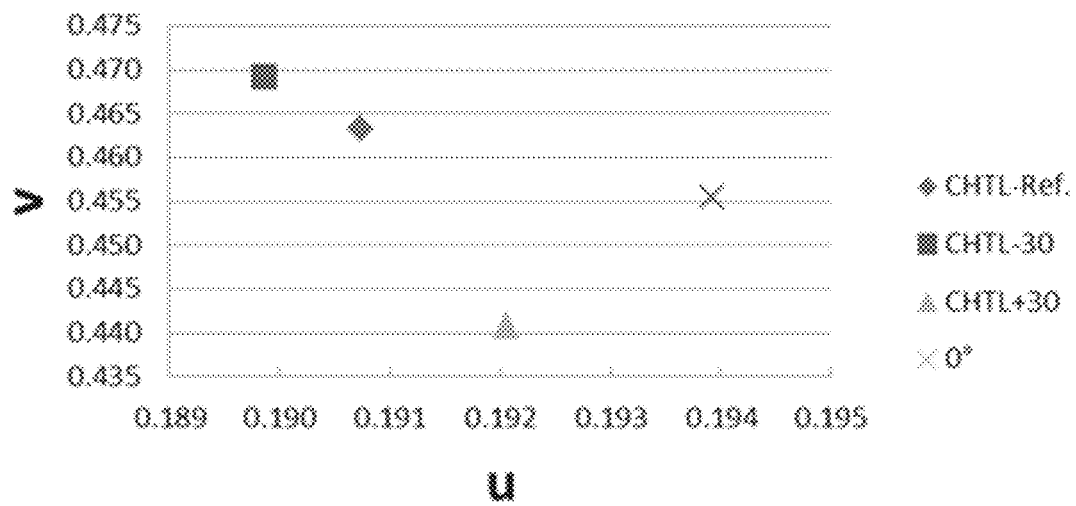
FIG. 12 shows a variation of the color shift value of the fitted white light at 50 degrees, in the CIE 1976 uniform chromaticity system, as a function of the thickness of the common hole transport layer.

Referring to FIG. 9, when the thickness of the common hole transport layer 31 is increased by 30 nm, the ratio of the blue sub-pixel is increased, and the angle-color shift trajectory of the synthesized white light gets close to the blue light. By adjusting the thickness of the common hole transport layer 31, the intensity of the microcavity effect of the blue light can be changed, which makes the chromaticity coordinate of the synthesized white light at a viewing angle of 50 degrees changes. The specific chromaticity changes are shown in Table 3. As can be seen from FIG. 9 and Table 3, the chromaticity coordinate of the fitted white light at the viewing angle of 50 degrees shifts toward the blue color as the common hole transport layer 31 (corresponding to C-HTL in the table) becomes thicker. Therefore, if the curved surface portion 22 is bluer than the flat surface portion 11 at the reference viewing angle (viewing angle of 0 degree), the film thickness of the common hole transport layer 31 in the curved surface portion 22 may be reduced. By applying this method to the CIE 1976 uniform chromaticity system for verification, it was found that the color shift distance at the viewing angle from 0 degree to 50 degrees decreases as the common hole transport layer 31 becomes thinner, as shown in FIG. 12. However, since the variation of the film thickness of the common hole transport layer 31 will cause a change in the ratio of the red and green sub-pixels, it is necessary to simultaneously increase the thickness of the hole transport unit of the red and green sub-pixels to compensate, so that the ratio of red and green sub-pixels remains unchanged, which is equivalent to adjusting the blue sub-pixels only. Therefore, when the color shift direction is toward the blue color, by reducing the thickness of the common hole transport layer 31 in the curved surface portion 22 and increasing the thickness of the hole transport unit of red and green sub-pixels in the curved surface portion 22, the visual effect of the curved surface portion and the visual effect of the flat surface portion is made the same. It should be noted that adjusting the thickness of the common hole transport layer 31 in the curved surface portion 22 will affect the ratio of all sub-pixels in the area, so it is preferably to perform the single-variable adjustment by using the hole transport unit 32 of the sub-pixel in the present disclosure.

that the display panel further includes a hole injection layer, the common hole transport layer 31 and the hole transport units 32 are usually formed on the hole injection layer. Of course, the common hole transport layer 31 and the hole transport units 32 may be formed on other possible positions, which are not listed herein one by one. For example, when forming the common hole transport layer 31 and the plurality of hole transport units 32, the common hole transport layer 31 may be formed on the anode 2 first, and then each hole transport unit 32 may be formed on the common hole transport layer 31. In this way, the manufacturing process is simple.

In the present exemplary embodiment, both the common hole transport layer 31 and the hole transport units 32 can be manufactured via evaporation. To make the hole transport layer has a different thickness in the flat surface portion 11 and the curved surface portion 22, a process including one masking step, which is originally used to form the common hole transport layer 31/the hole transport unit 32 with uniform thickness, needs to be changed into a process having two masking steps, and thus the original evaporating process is replaced with two evaporating processes. Therefore, two sets of masks are required now.

TABLE 3

The variation trend of the chromaticity coordinate of the fitted white light at the viewing angle of 50 degrees as a function of the change of thickness of C-HTL

| Thickness of C-HTL at edge bending zone (nm) | Chromaticity coordinate of the blue light (x, y) | Brightness value (cd/m$^2$) | Peak value (nm) | Full width at half maximum | Brightness of the fitted white light at 50° | Chromaticity coordinate of the fitted white light at 50° |
| --- | --- | --- | --- | --- | --- | --- |
| CHTL-Ref. −30 | (0.137, 0.059) | 72.1 | 460 | 23.1 | 214.7 | (0.304, 0.333) |
| CHTL-Ref. | (0.136, 0.064) | 78.6 | 459 | 25.5 | 214.5 | (0.300, 0.323) |
| CHTL-Ref. +30 | (0.131, 0.075) | 97.9 | 463 | 23.8 | 215.1 | (0.283, 0.289) |
| CHTL-Ref. +60 | (0.128, 0.085) | 104.6959 | 465 | 25.1 | 216.2 | (0.271, 0.265) |

As an example, in the above embodiments, the display effect when the flat surface portion 11 is vertically viewed at a viewing angle of 0 degree is the same as the display effect when the curved surface portion is viewed at a viewing angle of 50 degrees. Those skilled in the art may understand that when the shape, curvature, area, material properties, etc. of the curved surface change, the degree of the color shift will also change, thus the thickness to be adjusted will also change. The specific value of the reduced thickness needs to be determined based on a combination of multiple factors, and is not specifically limited herein.

This embodiment further provides a method for manufacturing the above organic electroluminescent display panel, the method includes the following steps.

In step S100, a common hole transport layer 31 is formed.

In step S200, a plurality of hole transport units 32 are formed.

The common hole transport layer 31 together with the hole transport units 32 constitute the hole transport layer 3. The organic electroluminescent display panel usually further includes a substrate 1, and an anode 2, an organic light-emitting layer 4, an electron transport layer 5, a cathode 6, and other structures formed on the substrate 1. The specific formation process of other structures will not be repeated herein.

The common hole transport layer 31 and the hole transport units 32 are usually formed on the anode 2. In the case The description will be made by taking an example in which the thickness of the common hole transport layer 31 in the curved surface portion 22 is smaller than that in the flat surface portion 11.

Figure 13:
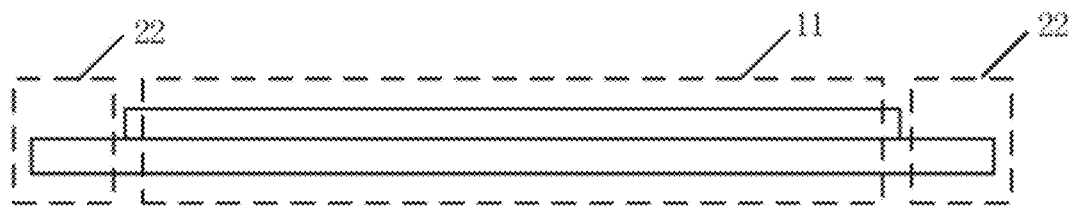
FIG. 13 is a schematic diagram of a first manufacturing method of a hole transport layer of the present disclosure.

In an exemplary embodiment, referring to FIG. 13, the common hole transport layer 31 is manufactured in step S100 according to the following steps.

In step S110, a first set of masks (e.g., a hollow mask with openings in both the flat surface portion 11 and the curved surface portion 22) is used to evaporate, in the flat surface portion 11 and the curved surface portion 22, a part of the common hole transport layer 31 on the anode that has common thickness in the flat surface portion 11 and the curved surface portion 22.

In step S120, a second set of masks (e.g., a hollow mask with an opening in the flat surface portion 11 and having no opening in the curved surface portion 22) is used to evaporate another part of the common hole transport layer 31, which is higher than the curved surface portion 22, on the prepared common thickness part in the flat surface portion 11, so that the evaporated common hole transport layer 31 have different film thickness in the flat surface portion 11 and the curved surface portion 22. The other hole transport units 32 having the same thickness in the flat surface portion 11 and the curved surface portion 22 and other layers may be evaporated by using a conventional method.

Figure 14:
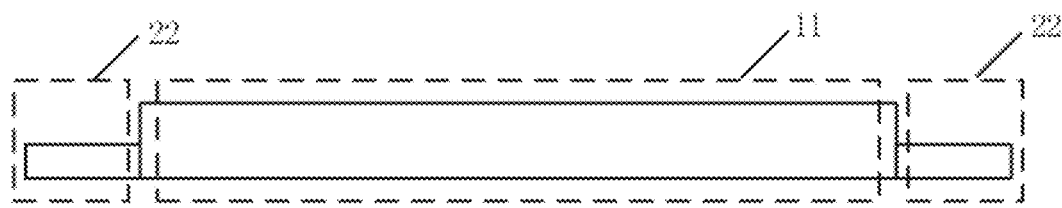
FIG. 14 is a schematic diagram of a second manufacturing method of a hole transport layer of the present disclosure.

In another exemplary embodiment, referring to FIG. 14, the common hole transport layer 31 is manufactured in step S100 according to the following steps.

In step S110, a fifth set of masks (e.g., a hollow mask with an opening in the flat surface portion 11 and having no opening in the curved surface portion 22) is used to evaporate a part of the common hole transport layer 31, which is located in the flat surface portion 11, on the anode in the flat surface portion 11.

In step S120, a sixth set of masks (e.g., a hollow mask with an opening in the curved surface portion 22 and having no opening in the flat surface portion 11) is used to evaporate a part of the common hole transport layer 31, which is located in the curved surface portion 22, on the anode in the curved surface portion 22, so that the evaporated common hole transport layer 31 has a different film thickness in the flat surface portion 11 and curved surface portion 22. The other hole transport units 32 having the same thickness in the flat surface portion 11 and the curved surface portion 22 and other layers may be evaporated by using a conventional method.

Similarly, the description will be made by taking an example in which the hole transport unit 32 of the red sub-pixel has smaller thickness in the curved surface portion 22 than that in the flat surface portion 11.

In an exemplary embodiment, referring to FIG. 13, the hole transport unit 32 is manufactured in step S200 according to the following steps.

In step S210, a third set of fine metal masks (FMM) is used to evaporate, in the flat surface portion 11 and the curved surface portion 22, a part of all hole transport units 32 of the red sub-pixel, which has common thickness in the flat surface portion 11 and the curved surface portion 22, on the anode.

In step S220, a fourth set of fine metal masks is used to evaporate, in the flat surface portion 11, another part of all hole transport units 32 of the red sub-pixels, which is higher than the curved surface portion 22, on the prepared part of the hole transport units, so that the evaporated hole transport units 32 of the red sub-pixels have different film thickness in the flat surface portion 11 and the curved surface portion 22. The other hole transport units 32 having the same thickness in the flat surface portion 11 and the curved surface portion 22 and other layers may be evaporated by using a conventional method.

In another exemplary embodiment, referring to FIG. 14, the hole transport unit 32 is manufactured in step S200 according to the following steps.

In step S210, a seventh set of fine metal masks is used to evaporate, in the flat surface portion 11, the hole transport units 32 having the thickness required for the red sub-pixels of the flat surface portion 11 on the anode.

In step S220, an eighth set of fine metal masks are used to evaporate, in the curved surface portion 22, the hole transport units 32 having the thickness required for the red sub-pixels of the curved surface portion 22 on the anode, so that the evaporated hole transport units 32 of the red sub-pixels have different film thickness in the flat surface portion 11 and curved surface portion 22. The other hole transport units 32 having the same thickness in the flat surface portion 11 and the curved surface portion 22 and other layers may be evaporated by using a conventional method.

It can be understood by those skilled in the art that the above first to eighth masks are only used to indicate that these masks are different, and are not intended to define the order. The method for manufacturing the hole transport units 32 of the sub-pixels of other colors, which have different thickness, is the same and will not be repeated here. The masks used for the common hole transport layer 31 and the hole transport unit 32 may be other masks besides hollow masks and fine metal masks, which is not specifically limited in the present disclosure. In addition, the numbers of the above steps are only for the convenience of description, rather than limiting the order of the steps. For example, the order of step S100 and step S200 can be changed under the understanding of those skilled in the art.

The present disclosure further provides a display device including the above organic electroluminescence display panel. There is no specific limitation on the application of the display device. The display device can be used for any product or component with display function, such as mobile phones, tablet computers, televisions, notebook computers, digital photo frames, and navigators.

Relative terms are used in this specification, for example, terms "above" and "below" is used to describe the relative relationship between one component of an icon and another component. However, these terms are used in this specification only for convenience, for example, according to the direction of the example described in the drawings. It can be understood that if the icon device is turned upside down, the component described as "above" will become the component "below". When a structure is "above" another structure, it may mean that the structure is integrally formed above the other structure, or that the structure is "directly" disposed on the other structure, or that the structure is "indirectly" disposed on other structure through another structure.

The terms "one", "a/an", "the", "said" and "at least one" are used to indicate the presence of one or more elements/components/etc.; the terms "including" and "having" are used to indicate an opening including and mean that there may be additional elements/components/etc. in addition to the listed elements/components/etc.

Those skilled in the art will easily think of other embodiments of the present disclosure after considering the description and practicing the invention disclosed herein. This application is intended to cover any variations, uses, or adaptive changes of the present disclosure that follow the general principles of the present disclosure and include common general knowledge or customary technical means in the technical field not disclosed in the present disclosure. The description and examples are to be considered exemplary only, and the true scope and spirit of this disclosure are pointed out by the appended claims.

What is claimed is:

1. An organic electroluminescence display panel having a flat surface portion and a curved surface portion, wherein a hole transport layer of the organic electroluminescence display panel comprises:
   a common hole transport layer distributed in the flat surface portion and the curved surface portion; and
   a plurality of hole transport units disposed on the common hole transport layer, and each hole transport unit of the plurality of hole transport units in a one-to-one relationship with every sub-pixel of the flat surface portion and the curved surface portion;
   wherein a thickness of the hole transport layer of each sub-pixel is a sum of a thickness of the common hole transport layer in each sub-pixel and a thickness of the hole transport unit of each subpixel, respectively, and
   wherein the thickness of the hole transport unit is selected so that the hole transport layer of each sub-pixel of at least one color has a different thickness in the flat surface portion and the curved surface portion.

2. The organic electroluminescence display panel according to claim 1, wherein the common hole transport layer has a different thickness in the flat surface portion and the curved surface portion.

3. The organic electroluminescence display panel according to claim 1, wherein the common hole transport layer has a different thickness in the flat surface portion and the curved surface portion, and the hole transport unit of the sub-pixel of at least one color has a different thickness in the flat surface portion and the curved surface portion.

4. The organic electroluminescence display panel according to claim 1, wherein the plurality of hole transport units are disposed on the same side of the common hole transport layer and close to an organic light-emitting layer of a corresponding sub-pixel.

5. A method for reducing color shift of an organic electroluminescent display panel, comprising:
providing the organic electroluminescent display panel, wherein the organic electroluminescent display panel has a flat surface portion and a curved surface portion, and a hole transport layer of the organic electroluminescent display panel comprises:
a common hole transport layer distributed in the flat surface portion and the curved surface portion; and
a plurality of hole transport units disposed on the common hole transport layer, and each hole transport unit of the plurality of hole transport units in a one-to-one relationship with every sub-pixel of the flat surface portion and the curved surface portion,
wherein a thickness of the hole transport layer of each sub-pixel is a sum of a thickness of the common hole transport layer in each sub-pixel and a thickness of the hole transport unit of each sub-pixel, respectively, and
wherein the thickness of the hole transport unit is selected so that the hole transport layer of each sub-pixel of at least one color has a different thickness in the flat surface portion and the curved surface portion;
determining a color shift direction of the curved surface portion relative to the flat surface portion at a reference viewing angle; and
adjusting the thickness of the hole transport layer of each sub-pixel in the curved surface portion according to the color shift direction.

6. The method for reducing color shift of the organic electroluminescent display panel according to claim 5, wherein adjusting the thickness of the hole transport layer of every sub-pixel in the curved surface portion comprises reducing the thickness of the hole transport unit of every sub-pixel of a certain color among red, green, or blue in the curved surface portion, if the color shift direction is toward a color direction of the certain color.

7. The method for reducing color shift of the organic electroluminescence display panel according to claim 5, wherein adjusting the thickness of the hole transport layer of every sub-pixel in the curved surface portion comprises reducing the thickness of the common hole transport layer in the curved surface portion and increasing the thickness of the hole transport unit of a red sub-pixel and the thickness of the hole transport unit of a green sub-pixel, if the color shift direction is toward a blue direction.

8. The method for reducing color shift of the organic electroluminescence display panel according to claim 6, wherein determining a color shift direction of the curved surface portion relative to the flat surface portion comprises:
obtaining chromaticity coordinate values of the flat surface portion and the curved surface portion at the reference viewing angle; and
comparing a positional direction of the chromaticity coordinate value of the curved surface portion relative to the chromaticity coordinate value of the flat surface portion in a chromaticity system, wherein the positional direction represents the color shift direction.

9. The method for reducing color shift of the organic electroluminescence display panel according to claim 7, wherein determining a color shift direction of the curved surface portion relative to the flat surface portion comprises:
obtaining chromaticity coordinate values of the flat surface portion and the curved surface portion at the reference viewing angle; and
comparing a positional direction of the chromaticity coordinate value of the curved surface portion relative to the chromaticity coordinate value of the flat surface portion in a chromaticity system, wherein the positional direction represents the color shift direction.

10. A display device, comprising:
an organic electroluminescence display panel having a flat surface portion and a curved surface portion, wherein a hole transport layer of the organic electroluminescence display panel comprises:
a common hole transport layer distributed in the flat surface portion and the curved surface portion; and
a plurality of hole transport units disposed on the common hole transport layer, and each hole transport unit of the plurality of hole transports units in a one-to-one relationship with every sub-pixel of the flat surface portion and the curved surface portion;
wherein a thickness of the hole transport layer of each sub-pixel is a sum of a thickness of the common hole transport layer in each sub-pixel and a thickness of the hole transport unit of each subpixel, respectively; and
wherein the thickness of the hole transport unit is selected so that the hole transport layer of each sub-pixel of at least one color has a different thickness in the flat surface portion and the curved surface portion.

* * * * *